(12) United States Patent
Cao et al.

(10) Patent No.: US 6,819,157 B2
(45) Date of Patent: Nov. 16, 2004

(54) DELAY COMPENSATION CIRCUIT

(75) Inventors: Xianguo Cao, Shanghai (CN); Obed Duardo, Coral Springs, FL (US); Bo Ye, Shanghai (CN)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/991,231

(22) Filed: Nov. 15, 2001

(65) Prior Publication Data

US 2003/0001634 A1 Jan. 2, 2003

(51) Int. Cl.$^7$ .............................................. H03H 11/26
(52) U.S. Cl. ...................... 327/262; 327/265; 327/279; 327/284; 327/378; 327/62
(58) Field of Search ................. 327/276–279, 327/261, 262, 264, 265, 270–273, 284–286, 151–155, 326, 378, 160, 161, 513, 58, 62–64, 362

(56) References Cited

U.S. PATENT DOCUMENTS

| | | | | |
|---|---|---|---|---|
| 4,646,030 A | * | 2/1987 | Hollister | 331/1 A |
| 4,677,648 A | * | 6/1987 | Zurfluh | 375/376 |
| 4,943,857 A | * | 7/1990 | Izuno et al. | 348/537 |
| 5,307,381 A | * | 4/1994 | Ahuja | 375/356 |
| 5,336,945 A | * | 8/1994 | Ikeda | 327/63 |
| 5,355,037 A | * | 10/1994 | Andresen et al. | 327/158 |
| 5,498,977 A | * | 3/1996 | Pickup | 326/31 |
| 5,752,011 A | * | 5/1998 | Thomas et al. | 395/556 |
| 5,883,534 A | * | 3/1999 | Kondoh et al. | 327/156 |
| 5,945,862 A | * | 8/1999 | Donnelly et al. | 327/278 |
| 5,990,713 A | * | 11/1999 | Zepp | 327/141 |
| 5,999,027 A | * | 12/1999 | Yamazaki | 327/161 |
| 6,002,282 A | * | 12/1999 | Alfke | 327/165 |
| 6,025,745 A | * | 2/2000 | Lee et al. | 327/277 |
| 6,175,928 B1 | * | 1/2001 | Liu et al. | 713/401 |
| 6,188,251 B1 | * | 2/2001 | Priemer et al. | 327/63 |
| 6,255,880 B1 | * | 7/2001 | Nguyen | 327/277 |
| 6,326,826 B1 | * | 12/2001 | Lee et al. | 327/161 |
| 6,327,318 B1 | * | 12/2001 | Bhullar et al. | 375/374 |
| 6,366,150 B1 | * | 4/2002 | Ishimi | 327/276 |
| 6,414,526 B1 | * | 7/2002 | Guinea et al. | 327/153 |
| 6,445,238 B1 | * | 9/2002 | Lesea | 327/262 |
| 6,445,661 B1 | * | 9/2002 | Wu | 369/59.2 |
| 6,504,408 B1 | * | 1/2003 | von Kaenel | 327/158 |

\* cited by examiner

*Primary Examiner*—Timothy P. Callahan
*Assistant Examiner*—Hai L. Nguyen

(57) ABSTRACT

A delay compensation circuit that determines the effects of process, voltage, and temperature (PVT) conditions of a chip by measuring the effective delay time of delay components inside the chip. The delay compensation circuit includes a plurality of sampler modules, each of which receives a delayed clock signal from one of a series of delay cells within a tapped delay circuit. The delay compensation circuit generates an output value based on the total number of sampling modules that lock into a fixed input signal using the delayed clock signals. Since the delay time of each delay cell changes based on variations of PVT conditions, the output values generated by the delay compensation circuit are determinate of PVT conditions in the chip. These output values can be used to design components to compensate for variances in PVT conditions or to control a variable delay component based on detected PVT conditions.

13 Claims, 9 Drawing Sheets

Expected Synchronizer Outputs for Worst Case Fast and Worst Case
Slow Conditions of DELC1V15 Delay Chips

| n | CLKn | Number of delays for CLKn | WCF | | WCS | |
|---|---|---|---|---|---|---|
| | | | delay (ns) | Sn | delay (ns) | Sn |
| 0 | CLK0 | 1 | 0.4 | 1 | 1.0 | 1 |
| 1 | CLK1 | 2 | 0.8 | 1 | 2.0 | 1 |
| 2 | CLK2 | 3 | 1.2 | 1 | 3.0 | 1 |
| 3 | CLK3 | 4 | 1.6 | 1 | 4.0 | 1 |
| 4 | CLK4 | 5 | 2.0 | 1 | 5.0 | 1 |
| 5 | CLK5 | 6 | 2.4 | 1 | 6.0 | 1 |
| 6 | CLK6 | 7 | 2.8 | 1 | 7.0 | 1 |
| 7 | CLK7 | 8 | 3.2 | 1 | 8.0 | 0 |
| 8 | CLK8 | 9 | 3.6 | 1 | 9.0 | 0 |
| 9 | CLK9 | 10 | 4.0 | 1 | 10.0 | 0 |
| 10 | CLK10 | 11 | 4.4 | 1 | 11.0 | 0 |
| 11 | CLK11 | 12 | 4.8 | 1 | 12.0 | 0 |
| 12 | CLK12 | 13 | 5.2 | 1 | 13.0 | 0 |
| 13 | CLK13 | 14 | 5.6 | 1 | 14.0 | 0 |
| 14 | CLK14 | 15 | 6.0 | 1 | 15.0 | 0 |
| 15 | CLK15 | 16 | 6.4 | 1 | 16.0 | 0 |
| 16 | CLK16 | 17 | 6.8 | 1 | 17.0 | 0 |
| 17 | CLK17 | 18 | 7.2 | 1 | 18.0 | 0 |
| 18 | CLK18 | 19 | 7.6 | 0 | 19.0 | 0 |
| 19 | CLK19 | 20 | 8.0 | 0 | 20.0 | 0 |
| 20 | CLK20 | 21 | 8.4 | 0 | 21.0 | 0 |
| 21 | CLK21 | 22 | 8.8 | 0 | 22.0 | 0 |
| 22 | CLK22 | 23 | 9.2 | 0 | 23.0 | 0 |
| 23 | CLK23 | 24 | 9.6 | 0 | 24.0 | 0 |
| 24 | CLK24 | 25 | 10.0 | 0 | 25.0 | 0 |
| 25 | CLK25 | 26 | 10.4 | 0 | 26.0 | 0 |
| 26 | CLK26 | 27 | 10.8 | 0 | 27.0 | 0 |
| 27 | CLK27 | 28 | 11.2 | 0 | 28.0 | 0 |
| 28 | CLK28 | 29 | 11.6 | 0 | 29.0 | 0 |
| 29 | CLK29 | 30 | 12.0 | 0 | 30.0 | 0 |
| 30 | CLK30 | 31 | 12.4 | 0 | 31.0 | 0 |
| 31 | CLK31 | 32 | 12.8 | 0 | 32.0 | 0 |
| PVT (Total An) | | | | 18 | | 7 |

FIGURE 8

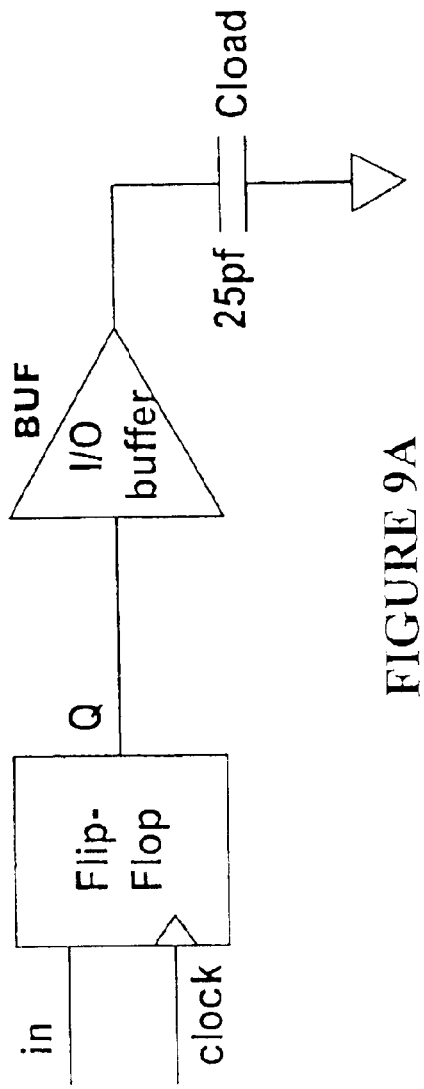
FIGURE 9A
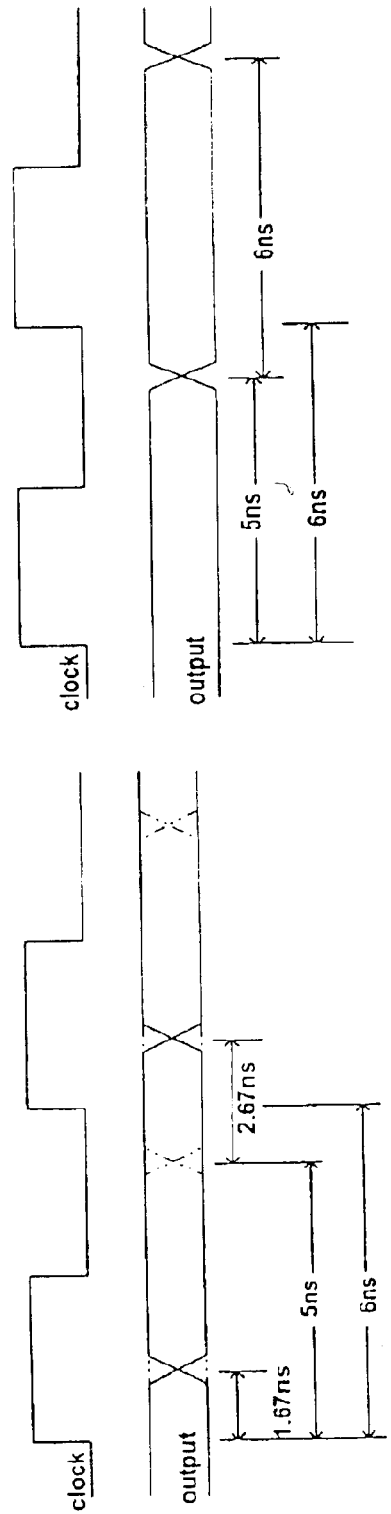
FIGURE 9C
FIGURE 9B

DELAY COMPENSATION CIRCUIT

BACKGROUND OF THE INVENTION

The present invention relates generally to synchronous circuit design, and more particularly, to a circuit for measuring and compensating for variations in the process, voltage and temperature (PVT) conditions of an integrated circuit.

DESCRIPTION OF THE RELATED ART

In digital circuits, synchronous logic elements operate by accepting and locking into a data signal during a transition of a clock signal. Such logic elements include D flip-flops, latch circuits, linear feedback shift registers (LFSRs), and counters. In order for a synchronous logic element to lock into a data signal, the signal must remain stable for some time prior to the clock edge, i.e., during a setup time. Also, the data signal usually must remain stable for some time after the clock edge, i.e., during a hold time, to be locked in by the synchronous logic element. If the data signal is not stable for both the setup time and the hold time of a synchronous logic element, the data signal may or may not be captured by the logic element.

FIG. 1A illustrates the operation of a synchronous logic element, specifically a D flip-flop DFF. In this example, the input data signal A is also used as the clock signal. Typically, the data signal and the clock signal are not shared, but instead are distinct signals. They are shown as sharing the same signal in FIGS. 1A and 1B to simplify the description of the related art. All descriptions herein apply to the case where the clock and data signals are distinct.

As shown in the timing diagrams of FIG. 1A, signal A is applied at the D input and clock input CK of the D flip-flop DFF. Therefore, the required setup time $T_{su}$ of the flip-flop DFF cannot be satisfied, and the Q output is indeterminate. This situation is shown in the timing diagram of FIG. 1A. However, such violations of setup time are not limited to instances where the input data signal is used to clock itself in a synchronous logic element.

For instance, clock skew (i.e., minor variations in the time at which clock signals arrive at their destinations in a chip) may cause the clock signal to arrive earlier than expected. Therefore, clock skew may cause a data signal to violate the setup time. Clock skew can be caused by, among other things, the process, voltage, and temperature (PVT) conditions of the synchronous logic element.

One way to prevent setup time violations is to add a delay element to the path of the clock signal. FIG. 1B shows a delay element added to the clock path of the D flip-flop DFF in FIG. 1A. As shown in the timing diagram of FIG. 1B, the delay element delays the signal A applied to the CK input by a time $T_d$, thereby shifting the clock edge such that the data signal is stable during the setup time $T_{su}$.

However, the delay time $T_d$ may vary according to the PVT conditions of the delay element. For example, if the temperature varies between from about −40°C. to 125° C., the supply voltage varies by +/−15%, and/or the process conditions of the delay element varies between worst case fast and worst case slow, the delay time $T_d$ may vary from below 50% to over 100% of the designated delay time $T_d$. Such changes in delay time $T_d$ may result in a violation of the setup time or the hold time of the D flip-flop DFF, or other types of synchronous logic elements.

One solution to this problem has been to use a type of variable delay element consisting of several small delay cells, where each small delay cell has a relatively short delay time $T_s$. The number of small delay cells within the variable delay element that are effectively used to delay the clock signal can be changed, based on PVT conditions. Accordingly, the delay time $T_d$ of the variable delay element (the sum total of delay times $T_s$ of the effective small delay cells) of the effective can be kept constant, despite variances in PVT conditions. The tapped delay circuit 10, illustrated in FIG. 2, is an example of such a variable delay circuit.

As shown in FIG. 2, a tapped delay circuit 10 is comprised of a group of tapped small delay cells SD1, ..., SD8, which are connected in series. The DELC1V15 delay component is an exemplary type of small delay cell SDn (n being within the range of 1 to 8 in FIG. 2) that can be used in tapped delay circuit 10. The DELC1V15 component has an expected delay time in worst case fast conditions of about 0.4 nanoseconds (ns), and an expected delay time during worst case slow conditions of about 1.0 ns. However, for the tapped delay circuit 10 and other subsequently described circuits, any component having a known delay time $T_s$ may be used instead of the DELC1V15 component. The desired resolution and the frequency of the input clock, CLK, generally determine the selection of the delay component.

As discussed above, each small delay cell SDn in FIG. 2 has a relatively short time delay time $T_s$. An input signal IN is input to the first small delay cell, and the delayed signal propagates from small delay cell SD1 to the next small delay cell SD2 to the next small delay cell SD3, etc., until it propagates to the last small delay cell SD8. Therefore, the signal at tap 1 will be delayed by $T_s$, the signal at tap 2 will be delayed by $2*T_s$, and so forth. Multiplexor MUXA selects and outputs the tap signal based corresponding to a series number received via control signal CTL.

FIG. 3 illustrates a variable delay control circuit 100, in which the delay time $T_d$ of tapped delay circuit 10 of FIG. 2 is controlled by shift register array 30 and phase detector 40, through adjustment of the series number. The number of small delay cells SDn in tapped delay circuit 10 is based on the desired resolution of variable delay control circuit 100.

The shift register array 30 contains the series number, which comprises a number of bits that corresponds to the number of small delay cells SDn. If the tapped delay circuit 10 has eight small delay cells SDn, as illustrated in FIG. 2, the shift register array 30 will hold a series number comprising eight digits. Each digit corresponds to a specific small delay cell tap. One of the digits contains a "1" bit while all of the other digits contain "0" bits. The digit containing the "1" bit corresponds to the tap whose signal is selected and output by multiplexor MUX A.

The variable delay control circuit 100 operates as follows. First, an input clock signal CLK is input to the first tapped delay circuit 10 of the tapped delay circuit 10. The tapped delay circuit 10 outputs a clock signal P_CK delayed according to delay time $T_d$, which is determined by the series number in shift register array 30. Both the delayed clock signal P_CK and the input clock signal CLK are sent to phase detector 40, which detects a phase difference between the input clock CLK and the delayed clock signal P_CK.

Based on a detected phase difference, phase detector 40 will generate either a right shift signal CSR or a left shift signal CSL, if necessary, which shifts the "1" bit of the series number in the shift register array 30 to either the left or right. As a result of the modified series number, the multiplexor MUX A of the tapped delay circuit 10 will select and output a different tap signal.

The variable delay control circuit 100 of FIG. 3 can be considered a type of delay-locked loop (DLL), because it synchronizes or aligns the delayed clock signal PCK$_{13}$ CK with the input clock signal CLK.

FIG. 4 illustrates a timing diagram including reference signals P_d0 and P_d1 of phase detector 40, which are generated based on clock signal CLK. Specifically, the phases of P_d0 and P_d1 define the boundaries of an optimally delayed clock signal. In other words, if the time delay T$_d$ of the tapped delay circuit 10 is within circuit design requirements (e.g., meet required setup and hold times), the phase of P_CK will fall between the phases of P_d0 and P_d1. Therefore, phase detector 40 compares the phase of P_CK signal to P_d0 and P_d1 to determine whether adjustments to the series number and parallel number are necessary.

Specifically, phase detector 40 checks whether the rising edge of signal P_CK falls between the rising edges of signals P_d0 and P_d1, i.e., falls within time window T$_w$. If the edge of P_CK does not fall within window T$_w$, then phase detector will generate CSR or CSL signals to modify the series number, thereby causing the phase of P_CK to shift to the left or right. For instance, if the rising edge of P_CK falls within time interval R1 of FIG. 4, where both P_d0 and P_d1 are high, phase detector 40 will generate a right shift signal CSR that causes the series number to decrease (i.e., cause the "1" bit to shift to the right), thereby causing P_CK to shift toward the left. Alternatively, if the rising edge of P_CK falls within time interval L1, where both P_d0 and P_d1 are low, the phase detector 40 will generate a left shift signal CSL that causes the series number to increase (i.e., cause the "1" bit to shift to the left), thereby shifting P_CK toward the right.

Once the rising edge of P_CK falls within window T$_w$, then the variable delay control circuit 100 determines that the delay time T$_d$ of the tapped delay circuit 10 is correct. However, a problem may arise within variable delay control circuit 100, which causes delay time T$_d$ to be set improperly set.

Specifically, when the system is powered on, the series number may be preset to a number that causes P_CK to be ahead of input clock signal CLK by a half cycle, or preset to a number that causes P_CK to be delayed by a full cycle with respect to CLK. Such a problem is caused variations in PVT conditions and may result in the delay times of each small delay cell SDn of the tapped delay circuit 10 to change from below −50% to above 100% of the normal delay time.

As a result of this problem, the edge of signal P_CK may fall within one of the time intervals L2 or R2 of the timing diagram in FIG. 4. If the rising edge falls in L2, the phase detector 40 will generate a right shift signal CSR causing the rising edge of P_CK to fall within the time window T$_w$ of interval HC (half a cycle late). Otherwise, if the rising edge falls in R2, phase detector 40 will generate a left shift signal CSL causing P_CK rising edge to fall within FC (a full cycle late).

Alternatively, the above problem may cause the edge of signal P_CK to fall within one of time intervals HC or FC. In this situation, the coarse phase detector 40 will not generate any right shift CSR or left shift signals CSL.

If the series number is set such that the rising edge of P_CK falls within either interval HC or FC, the delay time T$_d$ of variable delay circuit 20 will not be correctly set. Therefore, it would be advantageous to detect PVT conditions after the tapped delay circuit 10 is powered on, so that the series number of the shift register array can be correctly preset and the delay time of a variable delay circuit will meet the delay requirements (e.g., setup time and hold time of a synchronous logic unit).

Further, it would generally be advantageous in the related art to determine the effects of various PVT conditions on an integrated circuit for the purposes of programming the delay components of the chip or for designing circuits to compensate for the PVT conditions.

SUMMARY OF THE INVENTION

The present invention provides a delay compensation circuit, which measures PVT conditions of an integrated circuit by measuring the operating conditions of components inside the integrated circuit. In particular, the delay compensation circuit outputs digital signals representative of the PVT conditions, which depend on the effective delay time of delay components within the chip. Updated PVT information can be obtained periodically from the delay compensation circuit during and used to control variable delay circuits within the chip. Also, such information can be collected and used to determine the range of PVT conditions that a chip must operate under in a specific system or application. This information can be quite useful for designing chips that meet certain performance criteria, regardless of variations in PVT conditions.

In an exemplary embodiment of the present invention, the delay compensation circuit includes a plurality of sampler modules, each of which receives a delayed clock signal from a delay component within a tapped delay circuit. Therefore, the clock signal of each sampler module is delayed by a greater amount than the previous sampler module. When a fixed input signal is applied to each sampler module, the number of sampler modules that lock into the input signal is detected and converted into a value representative of the current PVT conditions.

Another exemplary embodiment of the present invention provides an improved variable delay control circuit that uses information obtained by the delay compensation circuit to control the delay time of the variable delay component to meet the setup and hold time requirements of a chip component despite variations in PVT conditions.

In another exemplary embodiment, the variable delay control circuit includes a variable delay component, which is a tapped delay circuit. The delay compensation circuit periodically measures the PVT conditions of the chip. The digitized output signals are encoded into a series number, which is transmitted from the shift register array to a multiplexor of the tapped delay circuit.

A variable delay control circuit utilizing the delay compensation circuit of the present invention can be used with a plurality of digital chips having setup and hold time requirements. Such chips may include input and output buffers, field programmable gate arrays (FPGAs), delay-locked loops (DLLs), digital phase-locked loops (PLLs), D flip-flops, and other types of synchronous logic elements. In addition, the PVT information provided by the delay compensation circuit of the present invention can be used for designing such chips to be used in timing critical applications.

In another exemplary embodiment of the present invention, a variation circuit stores the maximum and minimum values output by the delay compensation circuit. Such information can be used to determine the range of PVT operating conditions for a particular application, or to ensure that a chip is not operating outside of this range.

Advantages of the present invention will become more apparent from the detailed description given hereafter. However, it should be understood that the detailed description and specific examples, while indicating preferred embodiments of the invention, are given by way of illustration only, since various changes and modification within the spirit and scope of the invention will become apparent to those skilled in the art from this detailed description.

BRIEF DESCRIPTION OF THE DRAWINGS

The present invention will become more fully understood from the detailed description given below and the accompanying drawings, which are given for purposes of illustration only, and thus do not limit the present invention.

FIG. 8 is a table showing the expected synchronizing outputs for a delay compensation circuit using DELC1V15 components according to worst case fast and worst case slow conditions.

FIGS. 9A–9C illustrate a circuit including an output buffer whose timing critical design can be improved using the variable delay control circuit of the present invention.

DETAILED DESCRIPTION OF EXEMPLARY EMBODIMENTS

As described above, the present invention is directed to a delay compensation circuit, which measures the effects of PVT variations on a chip by measuring variations in the delay time of a delay component in the chip. The delay compensation circuit of the present invention can be utilized to program the delay time of a variable delay component and for providing information to be used in chip design to compensate for PVT conditions. Many of the figures referred to in connection with this detailed description contain similar components. The same reference labels will be used throughout the figures to denote similar components.

Figure 1A:
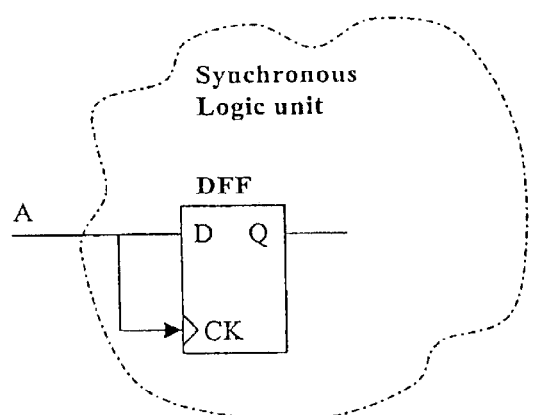
FIG. 1A illustrates the operation of a D flip-flop in which the data signal is also used as the clock signal.
Figure 1A:
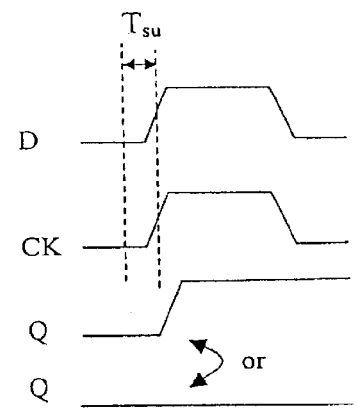
Figure 1B:
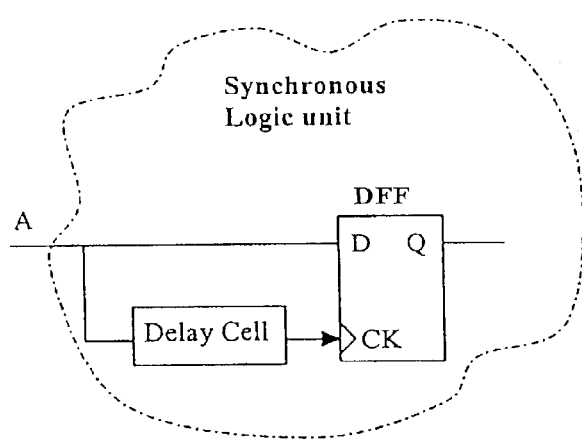
FIG. 1B illustrates the operation of a D flip-flop in which a delay element is inserted in the clock path.
Figure 1B:
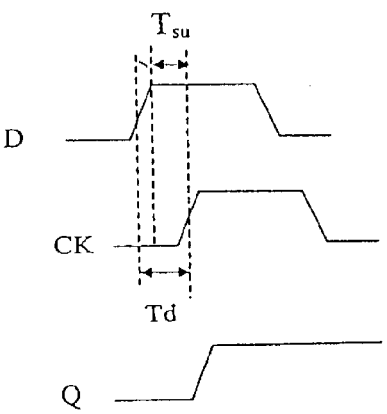
Figure 2:
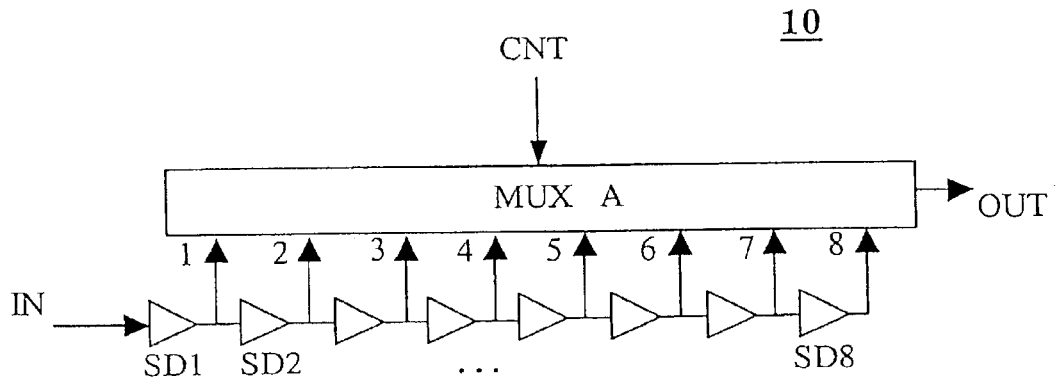
FIG. 2 illustrates a tapped delay circuit in the related art.
Figure 3:
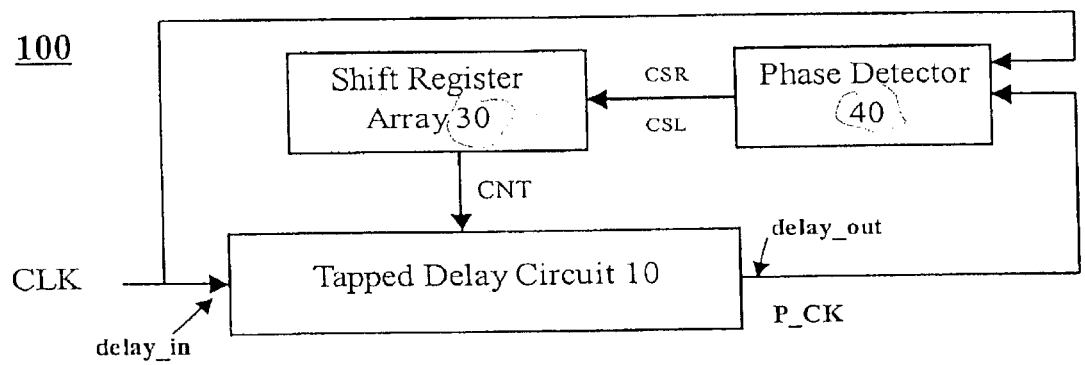
FIG. 3 illustrates a variable delay control circuit in the related art.
Figure 4:
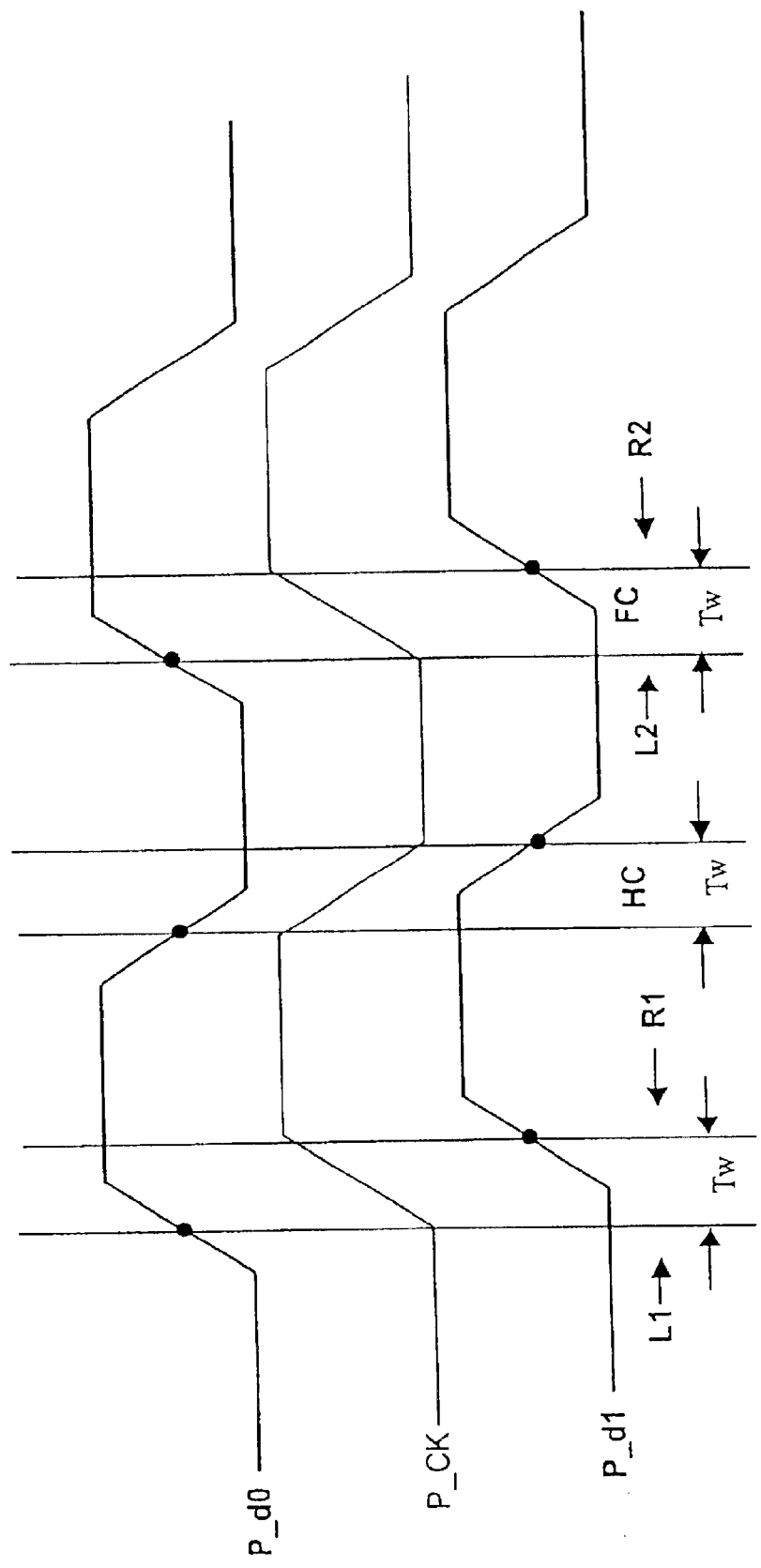
FIG. 4 illustrates a timing diagram including the internal signals of the phase detector in a variable delay control circuit of the related art.
Figure 5:
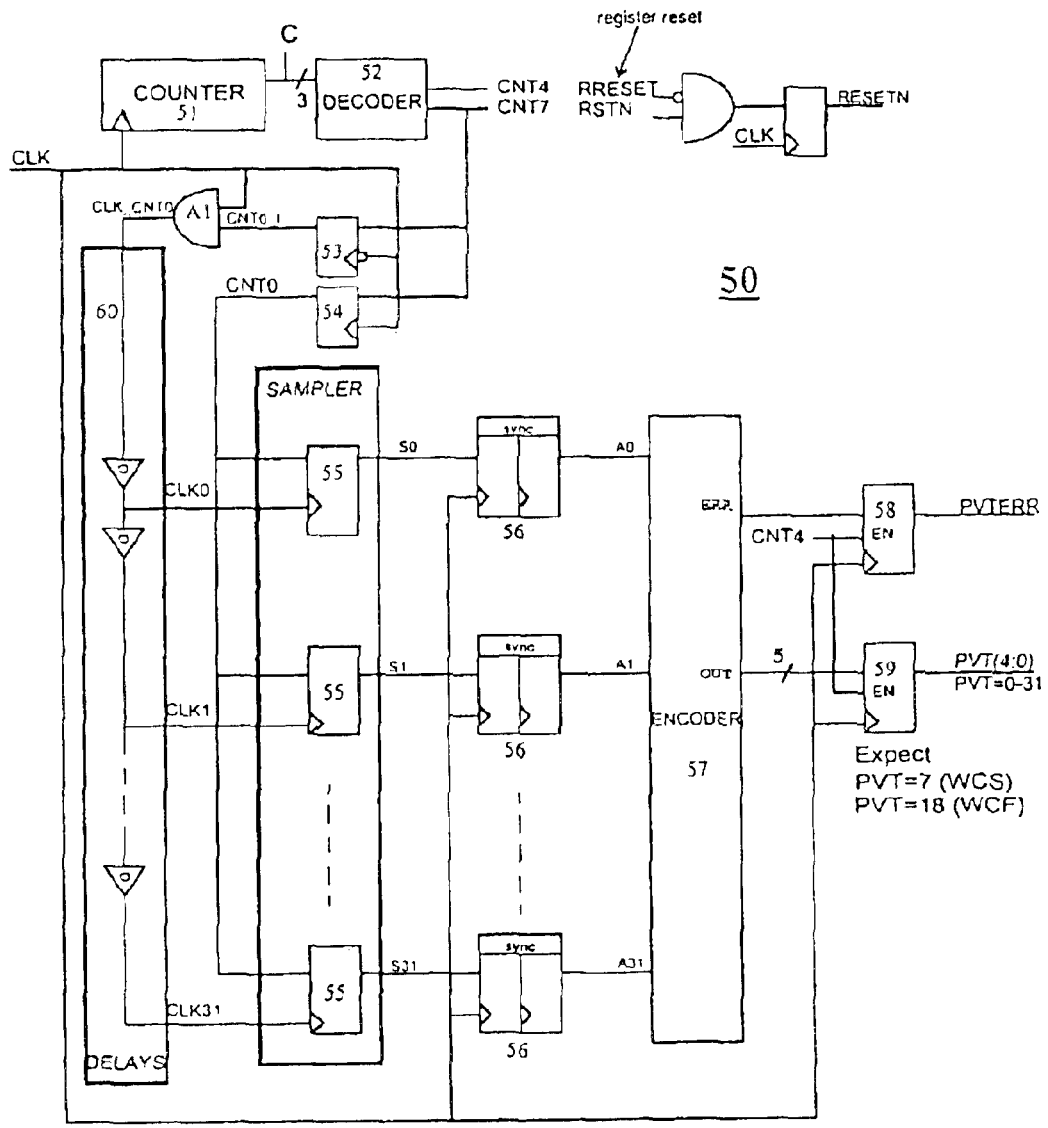
FIG. 5 illustrates a delay compensation circuit according to an exemplary embodiment of the present invention.

FIG. 5 illustrates a delay compensation circuit 50 according to an exemplary embodiment of the present invention. An external clock signal CLK is connected to counter 51, an input of logical AND gate A1, sampling modules 53 and 54, synchronizers 56, and latches 58 and 59. The output C of counter 51 is connected to decoder 52. Output CNT4 of the decoder 52 is connected to the EN terminals of latches 58 and 59, while output CNT7 is connected to the data inputs of samplers 53 and 54. The output CNT0_I of sampling module 53 is connected to an input of logical AND gate A1, while the output CNT0 of sampling module 54 is connected to the inputs of sampling modules 55. The output CLK_CNT0 of gate A1 is connected to the input of tapped delay circuit 60, which has a specific number m of delay cells D (in FIG. 5, m=32). Tapped delay circuit 60 differs from the tapped delay circuit 10 of FIG. 2, in that tapped delay circuit 60 does not include a multiplexor connected to the taps. Each tap of tapped delay circuit 60 is connected to the clock input of a sampling module 55. Each of the outputs $S_0, \ldots, S_m$ of sampling modules 55 are connected to the input of a corresponding synchronizing unit 56. The outputs of the synchronizing units 56 are connected to an encoder 57, which outputs an n-bit number (in FIG. 5, n=5) to latches 58 and 59.

In an exemplary embodiment, sampling modules 53, 54, and 55, synchronizers 56 and latches 58 and 59 may comprise flip-flops. In a further exemplary embodiment, the delay cells D of tapped delay circuit 60 may comprise DELC1V15 delay components. However, various types of circuits or components may be implemented as the sampling modules 53–55, synchronizers 56, latches 58 and 59, and delay cells D as will be apparent to those of ordinary skill in the art.

The operation of the delay compensation circuit 50 will now be described. When the circuit is first powered on, register reset signal RRESET or global reset signal RSTN causes reset signal RESETN to be asserted. Reset signal RESETN resets each of the elements 53, 54, 55, 58, and 59 to zero. When the reset signal RESETN is released, three-bit counter 51 counts the rising edges of clock signal CLK. Decoder 52 decodes the count value C of counter 51. As shown in the timing diagram of FIG. 7, on the fifth rising edge of CLK, count value C has a value of four and CNT4 becomes high (="1") for a period of one CLK cycle. Similarly, on the eighth rising edge of CLK, C has a value of seven and CNT7 becomes high for a period of one CLK cycle.

Sampling module 53 samples CNT7 on the falling edge of the clock signal CLK. Therefore, CNT0_I becomes high during the period when CNT7 is high. Sampling module 54 samples the value of CNT7 at the rising edge of clock signal CLK and generates CNT0 as the value of CNT7 delayed by one clock cycle. CNT0 is then transmitted to the data inputs of sampling modules 55.

A clock pulse CLK_CNT0 is generated by logically ANDing clock signal CLK and CNT0_I. The clock pulse CLK_CNT0 is transmitted through a series of delay cells D in tapped delay circuit 60. The tap of each delay cell D is connected to the clock input of a corresponding sampling module 55. Therefore, if the clock pulse CLK_CNT0 reaches a certain delay cell D, while the signal CNT0="1" (i.e., CLK_CNT0 reaches a delay cell D within one CLK cycle), then the sampling module 55 corresponding to that delay cell D will lock into, and correspondingly output, a high signal.

Figure 7:
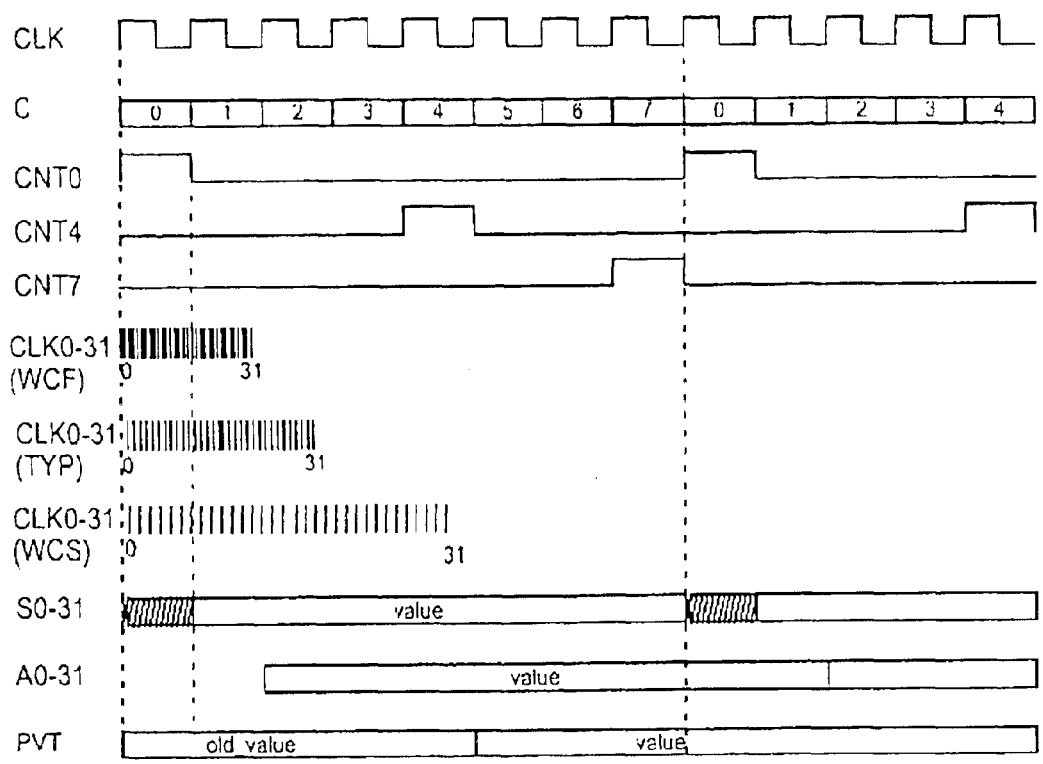
FIG. 7 illustrates a timing diagram of the input clock signal and signals within the delay compensation circuit.

The number of sampling module outputs $S_0, \ldots, S_{31}$ that have a value of "1" is dependent on the delay times of each delay cell D. The delay times of each delay cell D is, in turn, dependent on the PVT conditions. FIG. 7 shows the delayed clock signals CLK0, ..., CLK 31 that are output at the taps of tapped delay circuit 60. As shown in FIG. 7, as PVT conditions change from worst case fast to worst case slow, the delayed clock pulses CLK0, ..., CLK 31 become spaced farther apart, so that less of the delayed pulses CLK0, ..., CLK31 occur while CNT0="1". Accordingly, the number of sampling module outputs $S_0, \ldots, S_{31}$ that have a high value, corresponds to the PVT conditions of the chip in which the delay compensation circuit 50 is implemented.

Each sampling module outputs $S_0, \ldots, S_{31}$ is sent to its corresponding synchronizing unit 56. The synchronizing units 56 are driven by clock signal CLK and ensure that metastability is avoided. It should be noted, however, that synchronizing units 56 may not be needed if the sampling modules 55 are designed to prevent metastability at outputs $S_0, \ldots, S_{31}$. The synchronizing unit outputs $A_0, \ldots, A_{31}$, are encoded by encoder 57 into a five-bit PVT value. The value of PVT represents the placement of the most delayed clock pulse CLK0, ..., CLK31 that occurs when CNT0 is high. For example, if CLK14 is the most delayed pulse, $A_0$ to $A_{14}$ will be "1" and PVT will output "01110." The PVT value will be inversely related to the delay time of the delay cells D. In other words, as the delay time of delay cells D increases due to variances in PVT conditions, the PVT value output by encoder 57 will decrease.

The five-bit binary PVT value is latched onto by latch 59, when the value of CNT4="1", and output as the value PVT. However, the time at which the value is latched can be any time after A0-31 takes its value. In FIG. 7, this occurs at C=2. In this case, it is possible to design the delay compensation circuit 50 to latch the PVT value at C=3 (CNT3=1), C=4 (CNT4=1), or later.

At this point, the encoder 57 also outputs a PVTERR output, which is high whenever none of the synchronizing unit outputs $A_0, \ldots, A_{31}$ are "1," or whenever all of the synchronizing unit outputs $A_0, \ldots, A_{31}$ are "1". The signal PVTERR indicates that the value of PVT is not within the range of valid values, possibly as a result of a malfunction in one or more components of the delay compensation circuit 50 or as a result of the delay compensation circuit 50 operating outside the limits (temperature, voltage, or other limit) for which it was designed.

As described above, the number of delayed clock pulses CLK0 ... CLK31 that are output at the taps of the tapped delay circuit 60 depend on the PVT conditions of the delay cells D. In a preferred embodiment, the delay cells D of the tapped delay circuit 60 are DELC1V15 delay elements. For the DELC1V15 component, the expected delay time in worst case fast conditions is about 0.4 nanoseconds (ns), and the expected delay time during worst case slow conditions is about 1.0 ns. FIG. 8 illustrates the expected synchronizing unit outputs $A_1, \ldots, A_{13}$ for the worst case fast (WCF) and worst case slow (WCS) conditions of the DELC1V15 components. As seen in FIG. 8, during worst case fast conditions (WCF), eighteen of the synchronizing unit outputs ($A_0 \ldots A_{17}$) should output a "1," while during worst case slow conditions (WCS), only seven of the synchronizing unit outputs ($A_0 \ldots A_6$) should output a "1."

One advantage to using the DELC1V15 component is that it has a 1 ns delay in WCS conditions. This makes it easy to interpret the PVT value because the PVT value is equal to the integer value of the clock period in WCS operating conditions. For example, suppose the period of the input clock is 7.1 ns. In WCS conditions, this gives a PVT value of 7. If a PVT value of 14 is obtained (2×WCS value), then you know the chip is operating twice as fast as in WCS conditions (i.e. delay cells have ½ the delay than WCS conditions).

However, as will be evident to those of ordinary skill, other types of delay components having a known delay time $T_s$ can replace DELC1V15 component, especially delay components that are suited for the specific requirements of an integrated circuit in a particular application, e.g., delay resolution and input clock frequency.

In general, the following parameters are useful for analyzing the PVT value output by the delay compensation circuit 50:

PVT=ClockPeriod/DelayElementDelay.
PVTMAX=ClockPeriod/DelayElementWCFDelay
PVTMIN=ClockPeriod/DelayElementWCSDelay
DelayElementQuantity>ClockPeriod/DelayElementWCFDelay ClockPeriod is the period of clock signal CLK. DelayElementDelay is the delay time of one in delay cell D in tapped delay circuit 60. DelayElementWCFDelay and DelayElementWCSDelay are the delay times of one delay cell D in tapped delay circuit 60 in WCF and WCS conditions, respectively. The PVTMAX and PVTMIN are the maximum and minimum possible PVT values, and can be determined at the time of design. DelayElementQuantity is the number of delay cells D in taped delay circuit 60. The delay compensation circuit 50 of the present invention determines the PVT value.

In addition, it may be useful to scale the PVT value output by the delay compensation circuit 50, in order to provide easier interpretation of the results. This scaling can be performed by additional circuits or by software since a processor can access the PVT value. Here are some examples:

FastFactor=PVT/PVTMIN=DelayElementDelay/DelayElementWCSDelay
SlowFactor=PVT/PVTMAX=DelayElementDelay/DelayElementWCFDelay
ScaledPVT=(PVT−PVTMIN)*(ScaleRange/PVTRange)+ScaleMin where:
ScaleRange=ScaleMax−ScaleMin
PVTRange=PVTMAX−PVTMIN FastFactor indicates how fast the chip is operating relative to WCS conditions. A value of n indicates that the chip is n times faster than in WCS conditions. Similarly, the SlowFactor indicates how slow the chip is operating relative to WCF conditions. A value of n indicates that the chip is n times slower than in WCF conditions. The ScaledPVT value allows the PVT value to be represented over any value range. For example, to scale the PVT value from 0 to 100, ScaleMax=100 and ScaleMin=0. Scaling the PVT value results in values that are independent of the period of clock signal CLK, the delay cell delay time $T_s$, and the number of delay elements in tapped delay circuit 60. This makes possible a generic implementation that is technology (e.g. 0.16 micron) independent.

Referring again to FIG. 7, the three-bit counter 51 resets to zero after the count value C reaches seven. Therefore, the delay compensation circuit 50 illustrated in FIG. 5 is designed to generate a new PVT value every eight cycles of CLK. However, the frequency at which the PVT value is updated can be increased or decreased by simple modifications to the delay compensation circuit 50. For example, if the PVT value is to be updated every sixteen cycles, then the three-bit counter 51 may be replaced by a four-bit counter, and the decoder 52 can be configured to output a CNT15 signal (which becomes high at C=15). Other such design modifications (e.g., increasing CLK frequency) can be made to the delay compensation circuit 50 to increase or decrease the frequency at which the output value PVT is updated, as will be evident to those of ordinary skill.

It should be noted that FIG. 5 illustrates an exemplary embodiment of the delay compensation circuit 50 of the present invention and should not be construed as limiting the present invention. Various modifications and changes may be made to this circuit 50 without departing from the spirit and scope of the invention. For example, the number m of delay cells D, as well as the number n of bits output by decoder 57, may be changed according to a desired resolution for the PVT measurements.

As described above, the PVT output of the delay control circuit 50 can be used to monitor variances in the PVT conditions, such as changes in the voltage and temperature, of a chip. Since variances in PVT conditions affect the delay times of delay components, the delay compensation circuit 50 of the present invention can be very useful in controlling a variable delay component, such as the tapped delay circuit 10 of FIG. 2.

Figure 6:
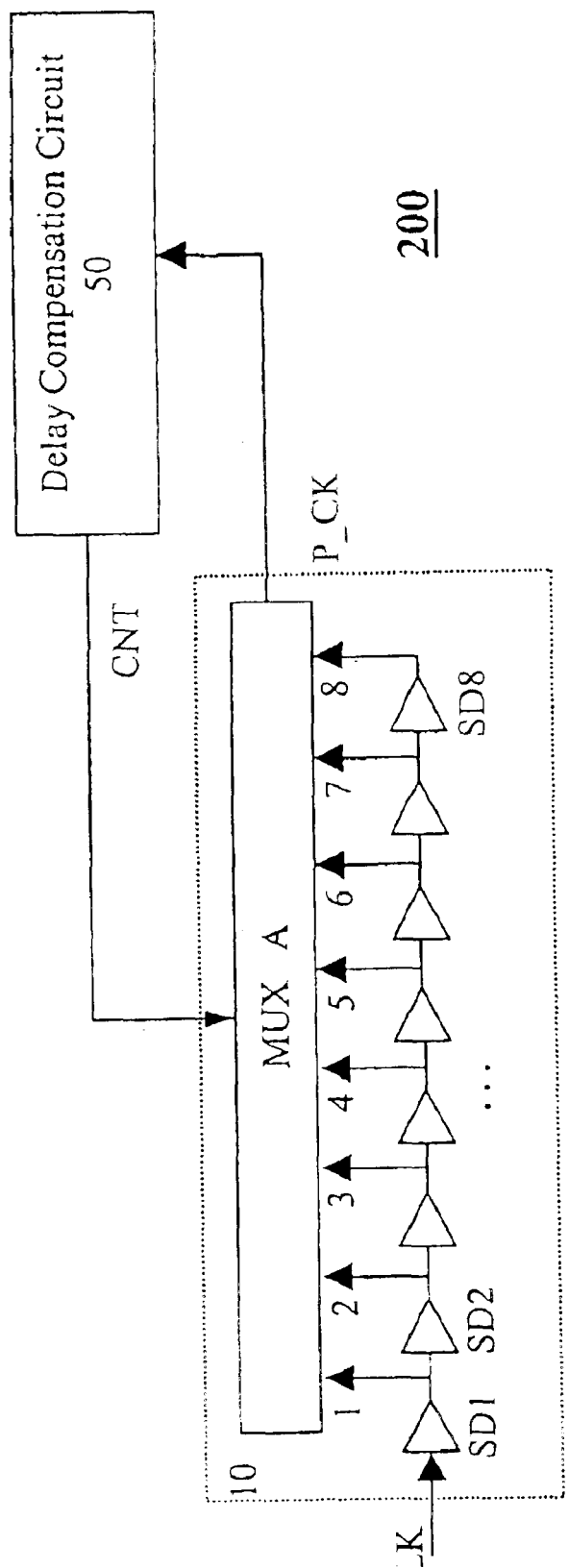
FIG. 6 illustrates a variable delay control circuit according to an exemplary embodiment of the present invention.

FIG. 6 illustrates a variable delay control circuit 200 that uses the delay compensation circuit 50 according to an exemplary embodiment of the present invention. In the variable delay control circuit 200 of FIG. 6, the output value PVT of the delay compensation circuit 50 is used to determine the series number for multiplexor MUX A, which is transmitted via control signal CNT. In this embodiment, if the desired delay time $T_d$ of the tapped delay circuit 10 is equal to the period of clock signal CLK, and the configuration of tapped delay circuit 10 is identical to the configuration of tapped delay circuit 60 in delay compensation circuit 50, with respect to the number and type of delay cells used, then the output value PVT of the delay compensation circuit 50 can be directly transmitted to and used by multiplexor MUX A as the series number. If this is not the case, an encoder element can be used to convert the output value PVT to a series number within the delay compensation circuit, or the multiplexor MUX A of the variable delay control circuit 200.

As noted above, in one exemplary embodiment, the tapped delay circuit 60 of delay compensation circuit 50 may be configured identically to the tapped delay circuit 10 of variable delay control circuit 200. In an alternative embodiment, the tapped delay circuit 60 of delay compensation circuit 50 may actually be the same circuit as the tapped delay circuit 10 of variable control device 200, by connecting the taps of each delay cell D in the tapped delay circuit 60 to both multiplexor MUX A of variable control circuit 200 and to the sampling modules 55 of delay compensation circuit 50.

Although FIG. 6 illustrates an embodiment in which the variable delay control circuit 200 is used to control the delay time $T_d$ of a tapped delay circuit 10. However, the variable delay control circuit 200 of the present invention is in no way limited to a tapped delay circuit 10. The variable delay control circuit 200 may used to control the delay time $T_d$ of any type of controllable or programmable variable delay component according to control signal CTL (which is generated from the output PVT of delay compensation circuit 50).

In an exemplary embodiment of the invention, the variable delay control circuit 200 can be used with timing critical applications, in which circuits are designed to operate the same way regardless of the PVT conditions. FIG. 9A illustrates a particular timing critical application, in which the circuit includes an output buffer BUF. In particular, buffer BUF must have an operating time window that will perform the required data operations, regardless of whether the circuit is operating according to worst case slow conditions or worst case fast conditions (i.e., regardless of PVT conditions).

In circuits such as the one shown in FIG. 9A, the worst case slow conditions can have a derating factor between 2.0 and 4.0 with respect to the worst case fast conditions. For the circuit in FIG. 9A, a derating factor of 3 will be assumed. Accordingly, if the clock signal has a 5 ns delay from the clock input to the buffer BUF output under worst slow conditions, then the delay under worst fast conditions will be about 1.67 ns (5/3=1.67). Therefore, the clock delay window is 5−1.67=3.33 ns (as shown in the timing diagram of FIG. 9B).

If the device connected to the output of buffer BUF has a setup requirement of 1.0 ns and a hold requirement of 0.5 ns, then the data valid window must be at least 1.5 ns. However, another 0.5 to 1.0 ns should be included in the data valid window to account for circuit board effects. Therefore, a data valid window can be as high as 2.5 ns, as shown in FIG. 9B. The operating window of buffer BUF, which is defined by the clock delay and the data valid portions, is about 6 ns (3.33+2.5=5.83 ns). Therefore, a data clock having a period of about 6 ns is required for the circuit of FIG. 9A.

However, the variable delay control circuit 200 of the present invention can be inserted in the clock path before buffer BUF to delay the clock signal. The variable delay control circuit 200 will control the delay to be nearly 0 ns for worst case slow conditions and 3.33 ns for worst case fast conditions. Therefore, the clock signal will be delayed for 5 ns by the variable delay control circuit 200 under all operating conditions, as shown in the timing diagram of FIG. 9C. Therefore, the 3.33 ns clock delay window caused by PVT variations can be eliminated from the operating window of buffer BUF, and the period of the clock signal can be reduced to about 3 ns. Accordingly, the variable delay control circuit 200 allows the clock signal frequency to be doubled.

Further, if a variable delay control circuit 200 and input buffer are used in conjunction with the device that receives the output of buffer BUF, the setup and hold times of this device can be significantly reduced (even reduced to nearly zero). Accordingly, the operating window of the circuit could be reduced to 1.5 ns, resulting in another doubling of the clock frequency.

The improvement of clock rate is one of the most important and challenging fields in chip design. The present invention can be used to improve the clock rates of chips used in many different applications. These applications may include input/output buffers, memories, FPGAs, digital PLLs, DLLs, synchronous logic elements, etc.

Besides compensating for delay variation, the present invention can be used to compensate for any other functional variation across PVT conditions, including but not limited to current drive, output impedance, and resistance. For example, an output buffer may be specified to provide 4 milliamps (ma) of current. However, its current drive capability varies with PVT conditions. Whereas it provides 4 ma in WCS conditions, it may provide 8 ma in WCF conditions. The PVT value can be used to enable or disable multiple parallel output buffers so that current drive variation is reduced significantly with respect to PVT conditions. Suppose four output buffers are connected in parallel and each is capable of providing 1 ma of current in WCS conditions and 2 ma of current in WCF conditions. The PVT value can be used to control which output buffers are enabled. In WCS conditions, all four output buffers are enabled to provide a total current of 4ma. In WCF conditions, only 2 output buffers are enabled to provide a total current of 4 ma. Such control improves not only chip performance but also board and system performance. By controlling output impedance across PVT conditions, signal integrity issues that are common in high speed board designs are minimized or eliminated and allow the board to be run at significantly higher speeds.

In addition to controlling components in a chip to compensate for PVT conditions, the determination of PVT values by the delay compensation circuit 50 of the present invention also provides chip designers with useful information.

Once a PVT value is known for a specific chip, it can only vary within a known range from that value. The process variation accounted for in the possible PVT range is with respect to all chips. For any one device, there is no process variation. Only temperature and voltage variation will affect the PVT value. Suppose the possible PVT range is from 7 to 18 for all chips, and the PVT values for any one device can span three values. If one device has a PVT value of 14, then it is known that the PVT range for this device is limited to 12, 13, 14, 15, and 16: three values in either direction including the 14. The minimum possible value of 12 means that this chip is at least 1.7 times faster than the slowest possible chip. This information can be used to adjust the clock frequency or any functional parameter to improve the performance.

For example, if a chip is designed to operate at 100 MHz in WCS conditions, its operation is typically limited to 100 MHz since it is not possible to know if conditions are such that faster operation is possible. If the chip is designed to be frequency scalable, as is common with processors, a PVT value of 12 would indicate that it could operate at 170 MHz. The chip performance is no longer limited to 100 MHz.

Further, if a different PVT value is obtained later, additional performance improvements could be made. For example, if the new PVT value is 15. This additional knowledge causes the PVT value of 12 to be eliminated as a possible value since it exceeds the known span of three values. This makes 13 the minimum possible PVT value and signifies that the chip is at least 1.85 times faster than the slowest possible chip. This scenario permits on-the-fly performance improvement as additional PVT values become available.

Also, if chip performance degrades over time for any reason, its clock frequency or any functional parameter can be modified to accommodate the degradation without causing a functional failure. Degradation which exceeds a specified range of PVT values or other PVT based criteria can be used to trigger a warning of impending failure. This information can be used to prevent costly unscheduled system failures.

Another exemplary embodiment of the present invention provides chip designers with useful information regarding the range of PVT conditions (i.e., variation of temperature, voltages, and processing conditions) that occur in a chip during a particular application. The range of PVT conditions can be determined by storing the maximum and minimum PVT values generated during the operation of delay compensation circuit 50.

Figure 10:
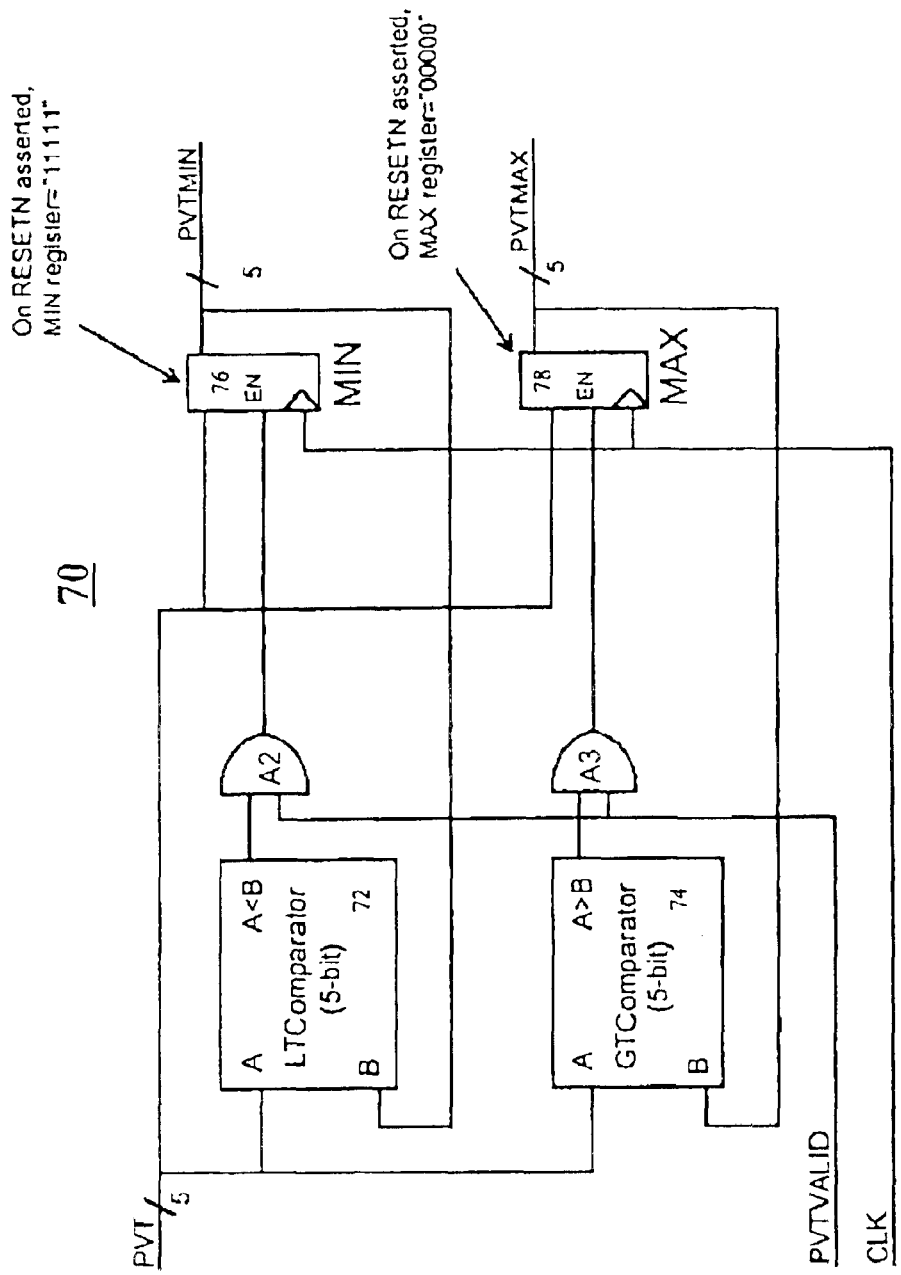
FIG. 10 illustrates a variation circuit according to an exemplary embodiment of the present invention.

In this embodiment, a variation circuit 70 is connected to the output of delay compensation circuit 50 to store the maximum and minimum generated PVT values. FIG. 10 illustrates a variation circuit 70 according to an exemplary embodiment of the present invention. The variation circuit 70 receives the PVT value output from the delay compensation circuit 50. The PVT value is sent to data inputs of MIN register 76 and MAX register 78, as well as to the A input terminals of comparators 72 and 74. The contents PVTMIN of MIN register 76 and PVTMAX of MAX register 78 are connected to the B input A terminal of comparators 72 and 74, respectively. The output of comparator 72 is sent to AND A logic gate A2, and the output of comparator 74 is connected to AND logic gate A3. The A signal PVTVALID is also connected to AND gates A2 and A3. The output of AND gates A2 and A3 are sent to the control input EN of registers 76 and 78, respectively. The clock signal CLK is connected to the clock inputs of registers 76 and 78.

In the exemplary embodiment of FIG. 10, the variation circuit 70 is configured to receive and process five-bit values, corresponding to the five-bit PVT output value of the delay compensation circuit 50 of FIG. 5. However, variation circuit 70 can be configured to process any n-bit values, in which n corresponds to the number of bits in the output value PVT of delay compensation circuit 50.

The operation of the variation circuit 70 will now be described. When reset signal RESTEN="0," MIN register 76 is initialized to binary value "11111" (31) and MAX register 78 is initialized to binary value "00000" (0). MIN register 76 stores the value PVTMIN (the minimum PVT value generated thus far), while MAX register 78 stores PVTMAX (the maximum PVT value generated thus far). When delay compensation circuit 50 generates a new PVT value, the new PVT value is compared to PVTMIN and PVTMAX.

If comparator 72 determines that the new PVT value is smaller than PVTMIN, its output becomes high. An AND operation is performed on the output of comparator 72 and PVTVALID, to ensure that this new PVT value is valid. If both the output of comparator 72 and signal PVTVALID are high, then a high signal is sent to the EN terminal of MIN register 76, causing the register 76 to accept the new PVT value as PVTMIN.

PVTMAX is similarly determined. If comparator 74 determines that the new PVT value is greater than PVTMAX, it outputs a "1." The output of comparator 74 is logically ANDed to PVTVALID, and if the result is "1", then a high signal is sent to MAX register 78, causing the register 78 to accept the new PVT value as PVTMAX.

As mentioned above, the signal PVTVALID ensures that the new value of PVT received from delay compensation circuit 50 is valid. PVTVALID originates from the delay compensation circuit 50. For example, the value of PVTVALID may be generated by inverting the value PVTERR, and logically ANDing the inverted PVTERR signal with a CNT5 output of decoder 52 (CNT5 is "1" when count value C=5). In such an embodiment, another register could be used to latch the PVT value that caused the error (i.e., caused PVTERR to go high) for further analysis.

Alternatively, the PVTVALID could be independent of PVTERR (using only the CNT5 signal of decoder 52), in which case the PVT value that caused the error is stored as either PVTMIN or PVTMAX. By examining PVTMIN and PVTMAX when PVTERR goes high, it can be determined whether the upper or lower operating limit was exceeded.

In an exemplary embodiment, the values PVTMIN and PVTMAX stored in variation circuit 70 can be used during chip design to adequately design components that compensate for the expected range of PVT conditions of a particular application. Further, during the operation of a chip, PVT values generated by delay compensation circuit 50 can be compared to the range of values determined by variation circuit 70, to determine whether the chip is operating under extraordinary conditions for which it was not designed.

The delay compensation circuit 50, variable delay control circuit 200, and variation circuit 70 can be used for the purposes described above, as well as for other purposes, as can be contemplated by those of ordinary skill in the art.

The invention being thus described, it will be obvious that the same may be varied in many ways. Such variations are not to be regarded as a departure from the spirit and scope of the invention, and all such modifications as would be obvious to one skilled in the art are intended to be included with the scope of the following claims.

What is claimed is:

1. An apparatus comprising:
   a conditioning circuit that receives a clock signal and outputs a first pulse signal and a second pulse signal;
   a tapped delay circuit including a plurality of tapped delay cells, said tapped delay circuit receiving the first pulse signal as input;
   a plurality of sampling modules concurrently receiving the second pulse as input, each sampling module receiving said second pulse signal as input while said first pulse signal propagates through said tapped delay circuit, each sampling module being clocked by a tapped output signal from one of said plurality of tapped delay cells; and
   an encoder for generating an output value based on a number of sampling modules that lock into said second pulse signal.

2. The apparatus of claim 1, wherein said output value represents the process, voltage, and temperature (PVT) conditions of a microchip.

3. The apparatus of claim 1, further comprising:
   an input for the clock signal;
   wherein said conditioning circuit includes a counter for counting the cycles of said clock signal, and said encoder generates said output value during predefined intervals defined by said clock signal.

4. The apparatus of claim 1, further comprising:
   a variation circuit for receiving said generated output value and comparing said generated output value to a previously stored maximum output value and a previously stored minimum output value,
   wherein, if said generated output value is less than said previously stored minimum output value, said generated output value is stored as said minimum output value, and
   wherein if said generated output value is greater than said maximum output value, said generated output value is stored as said maximum output value.

5. The apparatus of claim 4, wherein said minimum output value and said maximum output value stored in said variation circuit represents a range of process, voltage, and temperature (PVT) conditions for a microchip.

6. The apparatus of claim 1, wherein said plurality of tapped delay cells includes at least one DELC1V15 delay component.

7. The apparatus of claim 1, further comprising:
   a plurality of synchronizing elements for synchronizing the output signals from said plurality of sampling modules according to said clock signal,
   wherein the outputs of said plurality of synchronizing elements are input to said encoder.

8. A variable delay circuit comprising:
   a variable delay component for delaying an input signal, said variable delay component having a delay time that is controlled according to a control signal;
   a delay compensation circuit for measuring the process, voltage and temperature (PVT) conditions of a microchip and outputting a value representative of said measured PVT conditions, comprising:
      a conditioning circuit that receives a clock signal and outputs a first pulse signal and a second pulse signal;
      a first tapped delay circuit including a plurality of first tapped delay cells, said first tapped delay circuit receiving said first pulse signal as input;
      a plurality of sampling modules concurrently receiving said second pulse as input, each sampling module receiving said second pulse signal as input while said first pulse signal propagates through said first tapped delay circuit; each sampling module being clocked by a first tapped output signal from one of said plurality of first tapped delay cells;
   wherein said output value representative of said measure PVT conditions is used to generate said control signal for said variable delay component.

9. The variable delay circuit of claim 8, wherein said variable delay component is a second tapped delay circuit, which includes
   a plurality of second tapped delay cells connected in series;
   and a multiplexor for selecting and outputting a second tapped signal from one of said plurality of second tapped delay cells based on said control signal.

10. The variable delay circuit of claim 9, wherein said plurality of second tapped delay cells includes at least one DELC1V15 delay component.

11. The variable delay circuit of claim 8, wherein said delay compensation circuit further comprises:
   an encoder for outputting said value representative of PVT conditions based on a number of sampling modules that lock into said second pulse signal.

12. The variable delay circuit of claim 11, wherein said delay compensation circuit further includes
   an input for said clock signal;
   wherein said conditioning circuit includes a counter for counting the cycles of said clock signal, and said encoder generates said output value during predefined intervals defined by said clock signal.

13. An apparatus comprising:
   a variation circuit for receiving a generated output value and comparing said generated output value to a previously stored maximum output value and a previously stored minimum output value,
   wherein, if said generated output value is less than said previously stored minimum output value, said generated output value is stored as said minimum output value, and
   wherein if said generated output value is greater than said maximum output value, said generated output value is stored as said maximum output value.

* * * * *